(12) United States Patent
Kim et al.

(10) Patent No.: US 8,995,167 B1
(45) Date of Patent: Mar. 31, 2015

(54) REVERSE PROGRAM AND ERASE CYCLING ALGORITHMS

(71) Applicant: Adesto Technologies Corporation, Sunnyvale, CA (US)

(72) Inventors: David Kim, Cupertino, CA (US); Deepak Kamalanathan, Santa Clara, CA (US); Foroozan Sarah Koushan, San Jose, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 155 days.

(21) Appl. No.: 13/757,275

(22) Filed: Feb. 1, 2013

(51) Int. Cl.
*G11C 11/00* (2006.01)
*G11C 13/00* (2006.01)

(52) U.S. Cl.
CPC ........ *G11C 13/0069* (2013.01); *G11C 13/0097* (2013.01)
USPC .......................................... 365/148

(58) Field of Classification Search
CPC .................................................... G11C 13/0007
USPC .......................................... 365/148
See application file for complete search history.

(56) References Cited

U.S. PATENT DOCUMENTS

| 8,134,139 | B2 | 3/2012 | Lin et al. | |
|---|---|---|---|---|
| 2006/0256608 | A1* | 11/2006 | Chen et al. | 365/148 |
| 2007/0195581 | A1* | 8/2007 | Morimoto | 365/148 |
| 2012/0014163 | A1* | 1/2012 | Yamazaki et al. | 365/148 |

* cited by examiner

*Primary Examiner* — Hoai V Ho
(74) *Attorney, Agent, or Firm* — Michael C. Stephens, Jr.

(57) ABSTRACT

Structures and methods for controlling operation of a programmable impedance element are disclosed herein. In one embodiment, a method of programming the programmable impedance element can include: (i) receiving a program command to be executed on the programmable impedance element; (ii) performing a program operation on the programmable impedance element in response to the program command; (iii) determining if the program operation successfully programmed the programmable impedance element; and (iv) performing an erase operation for programming the programmable impedance element in response to the program operation failing to successfully program the programmable impedance element.

15 Claims, 9 Drawing Sheets

REVERSE PROGRAM AND ERASE CYCLING ALGORITHMS

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high programming current, as well as physical degradation of the memory cell over time. Other NVM technologies, such as resistive RAM (ReRAM) and conductive bridging RAM (CBRAM), may offer relatively low power and higher speeds as compared to flash memory technologies. CBRAM utilizes a programmable metallization cell (PMC) technology, which has the potential to scale to smaller sizes than flash memory devices.

SUMMARY

Embodiments of the present invention relate to controlling program and erase operation of a programmable impedance element.

In one embodiment, a method of programming the programmable impedance element can include: (i) receiving a program command to be executed on the programmable impedance element; (ii) performing a program operation on the programmable impedance element in response to the program command; (iii) determining if the program operation successfully programmed the programmable impedance element; and (iv) performing an erase operation for programming the programmable impedance element in response to the program operation failing to successfully program the programmable impedance element.

In one embodiment, a method of erasing the programmable impedance element, the method can include: (i) receiving an erase command to be executed on the programmable impedance element; (ii) performing an erase operation on the programmable impedance element in response to the erase command; (iii) determining if the erase operation successfully erased the programmable impedance element; and (iv) performing a program operation for erasing the programmable impedance element in response to the erase operation failing to successfully erase the programmable impedance element.

Embodiments of the present invention can advantageously provide for improved program and erase algorithms relative to conventional approaches. Particular embodiments are suitable for resistive random-access memory (ReRAM) and/or conductive bridging RAM (CBRAM) memory cells. These and other advantages of the present invention will become readily apparent from the detailed description of preferred embodiments below.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Particular embodiments may be directed to programmable metallization cells (PMC). Examples of such cells are shown and described in U.S. Pat. Nos. 6,635,914 and 7,359,236. The invention, in its various aspects, will be explained in greater detail below with regard to exemplary embodiments. The embodiments show structures and methods of operating PMCs that can be programmed/written and erased between one or more resistance and/or capacitive states.

Figure 1:
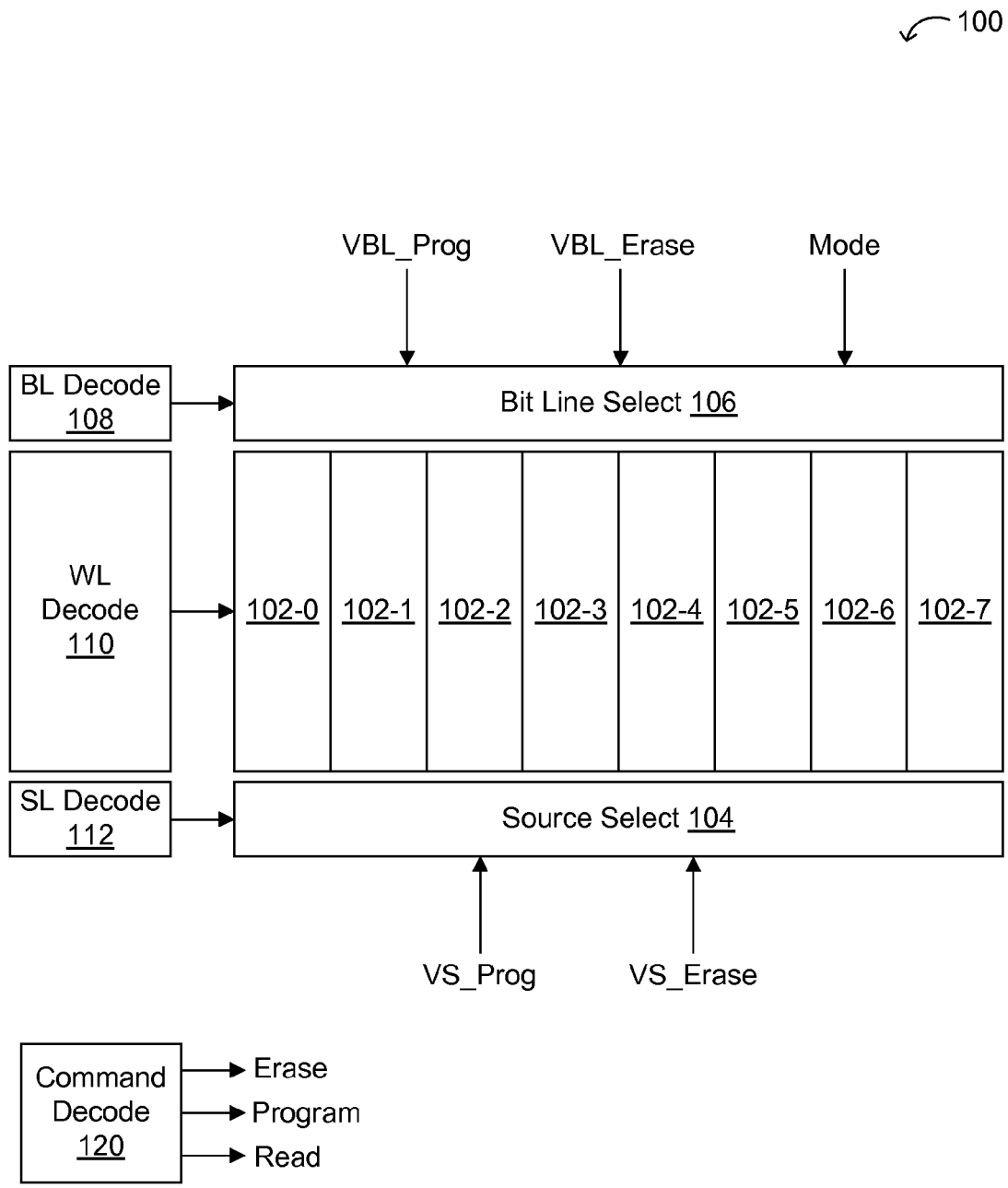
FIG. 1 is an example memory device arrangement.
Figure 2:
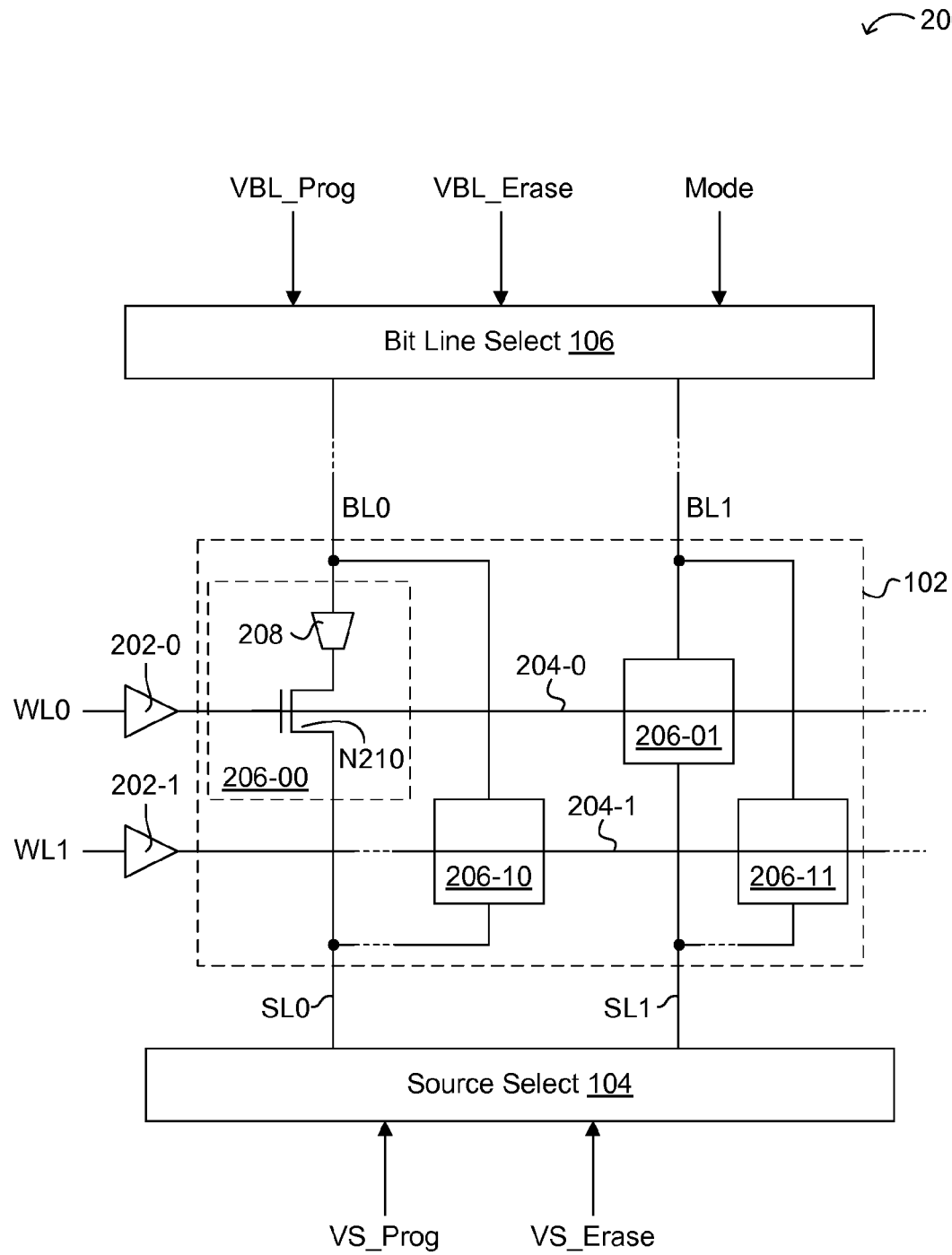
FIG. 2 is a diagram of an example memory device and memory cell structure.

FIGS. 1 and 2 show example memory architectures and circuit structures that can utilize PMCs, or other such devices, of particular embodiments. However, PMCs of particular embodiments are suitable for use in a wide variety of memory architectures and circuit structures.

Referring now to FIG. 1, an example memory device is shown and designated by the general reference character 100. A memory device 100 can include PMC sectors 102-0 to 102-7, source node selection circuitry 104, bit line selection circuitry 106, bit line decoding circuitry 108, word line decoding circuitry 110, and source line decoding circuitry 112. A memory device 100 can be a single integrated circuit or form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., program or erase operation control signals), as will be discussed in more detail below. In this way, command decoding circuitry 120 may be used to determine an operation to be performed on the device.

PMC sectors (102-0 to 102-7) can each include a number of memory cells arranged into one or more columns and multiple rows. Each memory cell can include one or more PMCs and a selection device. Generally, a PMC may be configured such that when a bias greater than a threshold voltage ($Vt_{PMC}$) is applied across electrodes of the PMC, the electrical properties of the PMC can change. For example, in some arrangements, as a voltage is applied across the electrodes of the PMC, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

In particular arrangements, one electrode of a PMC can be formed of a material including a metal that dissolves in the ion conductor when a sufficient bias is applied across the electrodes (oxidizable electrode), and the other electrode is relatively inert and does not dissolve during operation of the programmable device (an indifferent or "inert" electrode). For example, one electrode may be an anode during a write process and be comprised of a material including silver that dissolves in an ion conductor while another electrode may be a cathode during the write process and be comprised of an inert material, such as tungsten, nickel, molybdenum, platinum, metal silicides, and the like. Having at least one electrode formed of a material including a metal which dissolves in an ion conductor can facilitate maintaining a desired dissolved metal concentration within an ion conductor, which in turn, can facilitate rapid and stable electrodeposit formation within ion conductor or other electrical property change during use of a PMC. Furthermore, use of an inert material for the other electrode (cathode during a write operation) can facilitate electrodissolution of any electrodeposit that may have formed and/or return of the programmable device to an erased state after application of a sufficient voltage.

Referring still to FIG. 1, in the particular example shown, PMC sectors (102-0 to 102-7) can have a "bit line anode" configuration. That is, for each given memory cell, the anode of the corresponding PMC(s) can be connected to a bit line by a conductive connection that does not include the corresponding access device. Each such bit line may provide a read data path for the corresponding PMC. This represents just one example PMC architecture, and is in contrast to other PMC memory device architectures that have bit lines connected to a corresponding PMC via the access device of the cell. As noted above, PMCs in particular embodiments are suitable for use in any type of PMC memory device architecture.

In one example, PMC sectors (102-0 to 102-7) may also have a "strapped source line" architecture. Within each PMC sector, groups of access devices within each memory cell can have terminals formed by diffusions in an integrated circuit substrate. Groups of such diffusions can be "strapped" by a low resistance structure that provides a conductive connection between groups of such diffusion regions. Such an arrangement can be in contrast to a PMC architecture in which access devices may be directly connected to a bit line. Also, while eight PMC sectors (102-0 to 102-7) are shown in the particular example of FIG. 1, other examples may include fewer or greater numbers of PMC sectors. In FIG. 1, source node selection circuitry 104 can selectively connect source straps to various nodes depending upon the mode of operation and a source decoding value. In one particular example, source node selection circuitry 104 can connect a selected source strap between at least two different voltages, depending on whether the device is operating in a program operation or read operation, or in an erase operation.

Voltages VBL_Prog, VBL_Erase, VS_Prog, and VS_Erase may be generated power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage generator (e.g., based on a reference voltage) of an integrated circuit that includes memory device 100. In any event, such voltages may be used, either directly or indirectly, for programming (e.g., in a forward bias configuration) or erasing (e.g., in a reverse bias configuration) a PMC by applying suitable voltages across the electrodes thereof.

Bit line selection circuitry 106 can selectively connect bit lines of one or more PMC sections (102-0 to 102-7) according to a mode of operation and bit line decoding values. In one particular example, bit line selection circuitry 106 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Bit line selection circuitry 106, similar to source selection circuitry 104, can connect bit lines to an inhibit voltage for PMCs that are not selected for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected PMC device can be switched between program and erase operations. In this way, program and erase can be "symmetric" operations. That is, in a programming operation, a PMC to be programmed can be connected between suitable voltages (e.g., V1–V2) in an anode-to-cathode direction. In an erase operation, a PMC to be erased can be connected between suitable voltages (e.g., V2–V1) in an anode-to-cathode direction.

In this example, voltages V1 and V2 (not shown in FIG. 1) may be applied as one or more of voltages VBL_Prog, VBL_Erase, VS_Prog, and VS_Erase. This is in contrast to architectures that maintain a constant voltage on anodes of PMCs, and then provide program and erase voltages with respect to such a common anode voltage. In such a case, a supply voltage must be equal to a program voltage plus an erase voltage (Vprog+Verase). However, in a symmetric operation according to an embodiment, a program voltage may be an erase voltage, which may both be a supply voltage (Vprog=V1–V2, Verase=V2–V1, Supply voltage=V2–V1). In any event, a suitable voltage may be applied across a PMC in order to program the cell, and a reverse such voltage may be applied across the PMC in order to erase the cell.

Bit line decoding circuitry 108 can generate values for selecting given bit lines for read, program, and erase operations. In one arrangement, in response to address information (e.g., column address data), bit line decoding circuitry 108 can generate bit line select signals for application to bit line select circuitry 106.

Word line decoding circuitry 110 can generate values for selecting a given set of memory cells by enabling access devices in one or more selected rows of PMC sections (102-0 to 102-7). In response to address information (e.g., row address data), one or more word lines can be driven to a select voltage to thereby enable the corresponding select device (e.g., a transistor) in a row of memory cells. In this way, the PMCs of the selected row can be connected to a source node. Word lines can extend in a direction different than (e.g., essentially perpendicular to) the source straps.

Source decoding circuitry 112 can generate values for selecting given source straps. In one arrangement, in response to address information (e.g., column address data), source decoding circuitry 112 can generate source select signals for application to source node select circuitry 104. Source decoding circuitry 112 can select a source strap corresponding to a same memory cell as a selected bit line, and thereby enable a program, read, or erase operation.

In this way, a memory device can include PMCs as data storage elements with anodes commonly connected to bit lines and memory cell access devices connected to strapped and decoded sources. Such select circuitry can also provide for symmetrical program and erase operations utilizing bit line decoding and source strap decoding.

Referring now to FIG. 2, shown is a schematic block diagram of an example memory device and memory cell structure, as designated by the general reference character 200. Memory device 200 can be one implementation of the example shown in FIG. 1. Memory device 200 includes a PMC sector 102 that is shown for illustration purposes by four memory cells (e.g., 206-00, 206-10, 206-01, and 206-11), arranged into four columns and two rows (e.g., corresponding to WL0 and WL1). Two memory cells are shown connected to each of two bit lines BL0 and BL1. It is understood that the arrangement can be repeated to form a much larger memory cell array structure. Each memory cell (e.g., 206-00 to 206-11) can include a PMC 208 and an access device N210, which in this example is an n-channel insulated gate field effect (hereinafter "MOS") transistor. It is noted that while FIG. 2 shows an arrangement in which one PMC is provided per memory cell, alternate embodiments may include more than one PMC per memory cell.

PMCs 208 may have a structure as described in conjunction with FIG. 1, or equivalents. In the particular example of FIG. 2, PMC sector 102 also includes word line drivers 202-0 and 202-1. Word line drivers 202-0 and 202-1 can drive corresponding word lines 204-0 and 204-1 high to thereby select a memory cell 206, thus placing its corresponding access device (e.g., N210) into a low impedance state.

Read/write control circuitry within bit line selection circuitry 106 can vary in operation according to mode values. In a program operation, a read/write circuit can connect a selected bit line to an anode program voltage. In an erase operation, a read/write circuit can connect a selected bit line to an anode erase voltage. In a read operation, a read/write circuit can connect a selected bit line to a read bias voltage. Source line selection circuitry 104 can connect one or more of corresponding source straps (e.g., SL0 and SL1) to a source program voltage (VS_Prog), a source erase voltage (VS_Erase), or to a source de-select state. The source de-select state can be a high impedance state in the case of an "isolated" bit line architecture, or alternatively, can be a de-select bias voltage, in the case of a de-select bias architecture. Source line selection circuitry 104 can vary the number of source straps commonly driven to a same state. That is, source line selection circuitry 104 can select source straps connected to but one column of memory cells, or connected to multiple such columns.

Having described the various sections of FIG. 2, one example of the operation of such a memory device will now be described with reference to an operation that accesses memory cell 206-00. Initially, word lines 204 can be driven to a de-select voltage (e.g., low) by word line drivers 202. Bit line selection circuitry 106 can place bit lines BL0 and BL1 in the de-selected state. Similarly, source line selection circuitry 104 can place source straps SL0 and SL1 in the de-select state.

In a program operation (which may be part of a sequence of operations in a program "algorithm"), in response to address and mode data, bit line selection signals can be used to connect bit line BL0 to read/write control circuitry. In contrast, bit line BL1 can be de-selected, and thus placed in the de-selected state. Mode selection values can result in read/write control circuitry connecting the selected bit line (e.g., BL0) to an anode program voltage. A program operation can also include source selection signals connecting source strap SL0 to a source program voltage (e.g., VS_Prog), while connecting source strap SL1 to a source de-select state. A word line driver (e.g., 202-0) corresponding to the selected memory cell can be driven to a select voltage, thereby placing the selected PMC (e.g., PMC 208 of memory cell 206-00) between suitable programming voltages.

An erase operation (which may be part of a sequence of operations in an erase "algorithm") can occur in the same general fashion, but with the erase voltage being applied to the selected bit line and source erase voltage (e.g., VS_Erase) being applied to a selected source strap. As noted in the example of FIG. 1, in particular embodiments, such an operation can be symmetrical, such that the anode programming voltage equals VS_Erase, and the anode erase voltage equals VS_Prog. Also, while FIG. 2 shows n-channel MOS transistors as access devices, other embodiments may include different types of access devices. In such alternate embodiments, word line drivers 202 would provide appropriate voltages and/or currents to enable such access devices. In this way, bit line selection, source selection, and word line activation can be utilized to program and/or erase a PMC array having bit lines connected to anodes of PMCs within multiple memory cells.

While particular example architectures and circuits suitable for PMCs, and memory arrays formed thereof, with respect to FIGS. 1 and 2 have been described, programmable impedance elements in certain embodiments are suitable to a wide variety of architectures, structures, and/or circuit arrangements.

Figure 3:
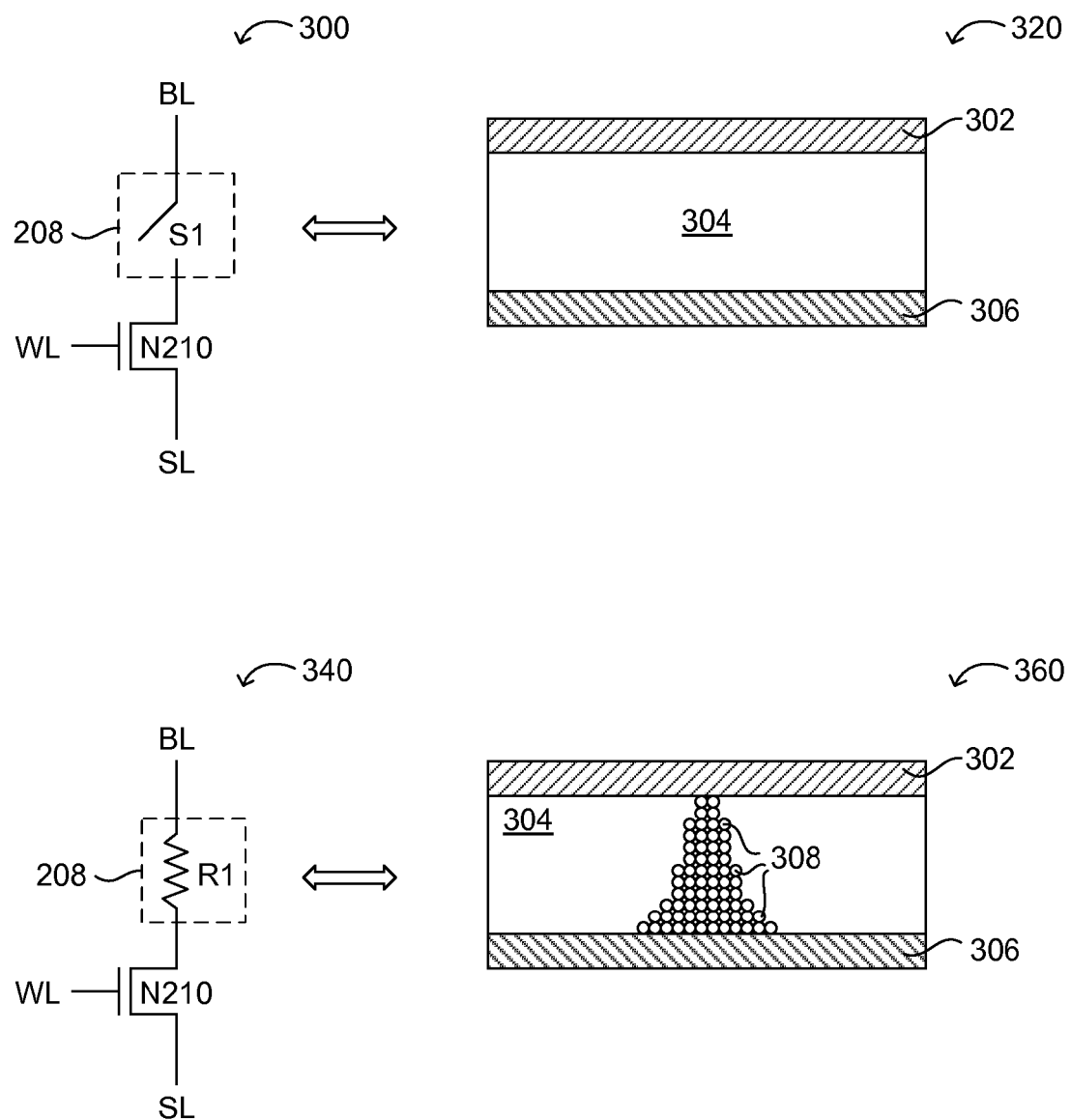
FIG. 3 is a diagram of an example programmable impedance element with schematic modeling.

Referring now to FIG. 3, shown is a diagram of an example programmable impedance element with corresponding schematic modeling. Example 300 shows a memory cell with an open switch S1 representation of PMC 208. The PMC portion of this representation corresponds to the cross-section diagram 320, which represents a PMC or programmable impedance element in a high impedance state (e.g., state "0"), or an erased state. Partially dissolved or erased states may also be detected as a data state "0," or a multi-bit value, in some applications, and depending on the read-trip point. As used herein, "PMC" may be one example of a "programmable impedance element." In this example, PMC 320 can include electrochemically active electrode 302, solid electrolyte 304, and inert electrode 306.

Schematic representation 340 and corresponding cross-section diagram 360 show examples of PMC 208 in a low impedance state (e.g., state "1"), or a programmed state. Partial conductive paths may also be detected as a data state "1," or a multi-bit value, in some applications, and depending on the read-trip point. Example 340 shows a memory cell with a resistor R1 or closed switch representation of PMC 208. The PMC portion of this representation corresponds to the cross-section diagram 360. In the example 360, electrodeposits 308 can form in solid electrolyte 304 to form a "bridge" or conductive path between electrochemically active electrode 302 and inert electrode 306. For example, electrodeposits 308 can be from active electrode 302, and may include silver. As shown in examples 300 and 340, a control transistor (e.g., N210) can also be included in each memory cell including the programmable impedance element or PMC 208. For example, transistor N210 can be controlled by a word line 204, as discussed above with respect to FIG. 2.

PMC is based on a physical re-location of ions within a solid electrolyte (e.g., 304). A PMC memory cell or programmable impedance element may be formed of two solid metal electrodes 302 and 306, one relatively inert (e.g., 306) and the other electrochemically active (e.g., 302), with a relatively thin film of the electrolyte (e.g., 304) between the electrodes. As shown in the cross-section diagrams herein, however, the solid electrolyte layer is shown as thicker than the electrodes for illustration purposes. Also, other types or arrangements of electrodeposits 308 can be found in other programmable impedance element structures that are also suitable for use in particular embodiments.

Solid electrolyte 304 can include a chalcogenide compound, such as a germanium selenium (Ge—Se) compound. Solid electrolyte 304 can be formed by photodissolution of metal into a chalcogenide base glass. Chalcogenide materials are chemical compounds consisting of at least one chalcogen ion (a chemical element in column VI of the periodic table, also known as the oxygen family). More precisely, the term chalcogenide refers to the sulphides, selenides, and tellurides. PMCs may utilize the ionic conduction of compounds containing metallic ions.

Certain metals can be added to thin films of chalcogenide glasses by photodissolution. When Ag is combined in this fashion with Ge—Se or Ge—S glasses, the resulting ternary may contain a dispersed nanocrystalline $Ag_2S(e)$ phase that has relatively large quantities of mobile metal ions. The presence of these ions allows the ternaries to act as solid electrolytes. If an anode that has an oxidizable form of the ionic metal and an inert cathode are applied in contact with such a phase-separated electrolyte, an ion current of mobile elements (e.g., positively charged metal ions) can flow under an applied voltage bias. Electrons from the cathode can reduce the excess metal due to the ion flux and an electrodeposit (e.g., 308) forms on or in the electrolyte (e.g., 304). Also, other materials, such as certain oxides (e.g., tungsten oxide, hafnium oxide, nickel oxide, titanium oxide, transition metal oxides, etc.), can be used, as opposed to Ge—S and Ge—Se chalcogenide glasses. In addition, other metals, such as copper, can be used in place of silver, for the electrochemically active electrode that supplies mobile ions.

Various materials can be utilized to form electrodes 302 and 306. For example, inert electrode 306 can include tungsten, and electrochemically active electrode 302 can include silver or copper. In operation, when a negative bias is applied to inert electrode 306, metal ions in solid electrolyte 304, as well as some originating from the now-positive active electrode 302, can flow in solid electrolyte 304, and are reduced or converted to atoms by electrons from inert electrode 306. After a relatively short period of time, the ions flowing into the filament form a small metallic effective "nanowire" or conductive path between the two electrodes. Such a nanowire can lower the resistance along the conductive path between electrodes 302 and 306, as represented by the open switch model in schematic 300 and the resistor model in schematic 340. Also, the lowered resistance across electrodes 302 and 306 can be measured to indicate that the writing or programming process is complete.

Such a nanowire may not be a continuous wire, but rather a chain of electrodeposit islands or nanocrystals (electrodeposits) 308. A conductive path between the electrodes may appear as more of the chain of electrodeposits under certain operating conditions, particularly at relatively low programming currents (e.g., less than about 1 µA). However, higher programming currents can lead to a mostly metallic conductor or conduction path. Also, and as discussed above, reading the cell data can include switching on the control transistor (e.g., N210), and applying a relatively small voltage across the cell. If a nanowire is in place in that cell (e.g., 360), the resistance can be relatively low, leading to higher current, and that can be read as a "1" data value stored in that cell. However, if there is no nanowire or conductive path between electrodes in the cell (e.g., 320), the resistance is higher, leading to low current, and that can be read as a "0" data value stored in that cell.

Cell data can be erased in similar fashion to cell writing or programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a PMC can be substantially symmetric to a program or write operation.

Thus in conductive bridging random-access memory (CBRAM) applications, metal ions can dissolve readily in the material (e.g., 304) between the two electrodes (e.g., 302 and 306). In contrast, in resistive RAM (ReRAM) applications, the material between the electrodes may require a high electric field that can cause local damage in may produce a trail of conducting defects (a "filament"). Thus, for CBRAM, one electrode provides the dissolving ions, while for ReRAM, a one-time "forming" step may be required to generate the local damage.

However, some CBRAM program operation failures can be attributed to a "reverse" erase effect whereby cell resistance is actually increased as a result of a program operation. Similarly, some CBRAM erase operation failures can be attributed to a reverse program effect whereby cell resistance is actually decreased as a result of an erase operation. Also, more voltage, current, or time for subsequent attempts at programming or erasing a given storage cell may not necessarily provide suitable results, and in some cases may exacerbate the situation. Further, different cell structures can exhibit reverse program/erase effects, likely at different operating voltages or conditions.

Example Method of Controlling a Programmable Impedance Device

In one embodiment, a method of programming a programmable impedance element can include: (i) receiving a program command to be executed on the programmable impedance element; (ii) performing a program operation on the programmable impedance element in response to the program command; (iii) determining if the program operation successfully programmed the programmable impedance element; and (iv) performing an erase operation for programming the programmable impedance element in response to the program operation failing to successfully program the programmable impedance element.

In one embodiment, a method of erasing a programmable impedance element, the method can include: (i) receiving an erase command to be executed on the programmable impedance element; (ii) performing an erase operation on the programmable impedance element in response to the erase command; (iii) determining if the erase operation successfully erased the programmable impedance element; and (iv) performing a program operation for erasing the programmable impedance element in response to the erase operation failing to successfully erase the programmable impedance element.

Particular embodiments can include a selectable operation algorithm for executing a program or erase command by performing one or more of a plurality of program and erase operations. Thus, a command supplied to a memory device and decoded (e.g., via 120) as a program may be carried out on a semiconductor memory device according to the selected program operation algorithm. Further, the selected program operation algorithm can include one or more program and erase operations, each with conditions determinable by option variables, which may be accessible from a register. Similarly, a command decoded as an erase command may be carried out on a semiconductor memory device according to the selected erase operation algorithm. Further, the selected erase operation algorithm can include one or more of erase and program operations, each with conditions determinable by option variables, which may be accessible from a register. In addition, a retry operation can be included in some of the program and erase operations, as defined by the particular algorithm. In a retry operation, a previous program or erase operation is repeated if not fully successful up until a maximum retry count value is reached.

Figure 4:
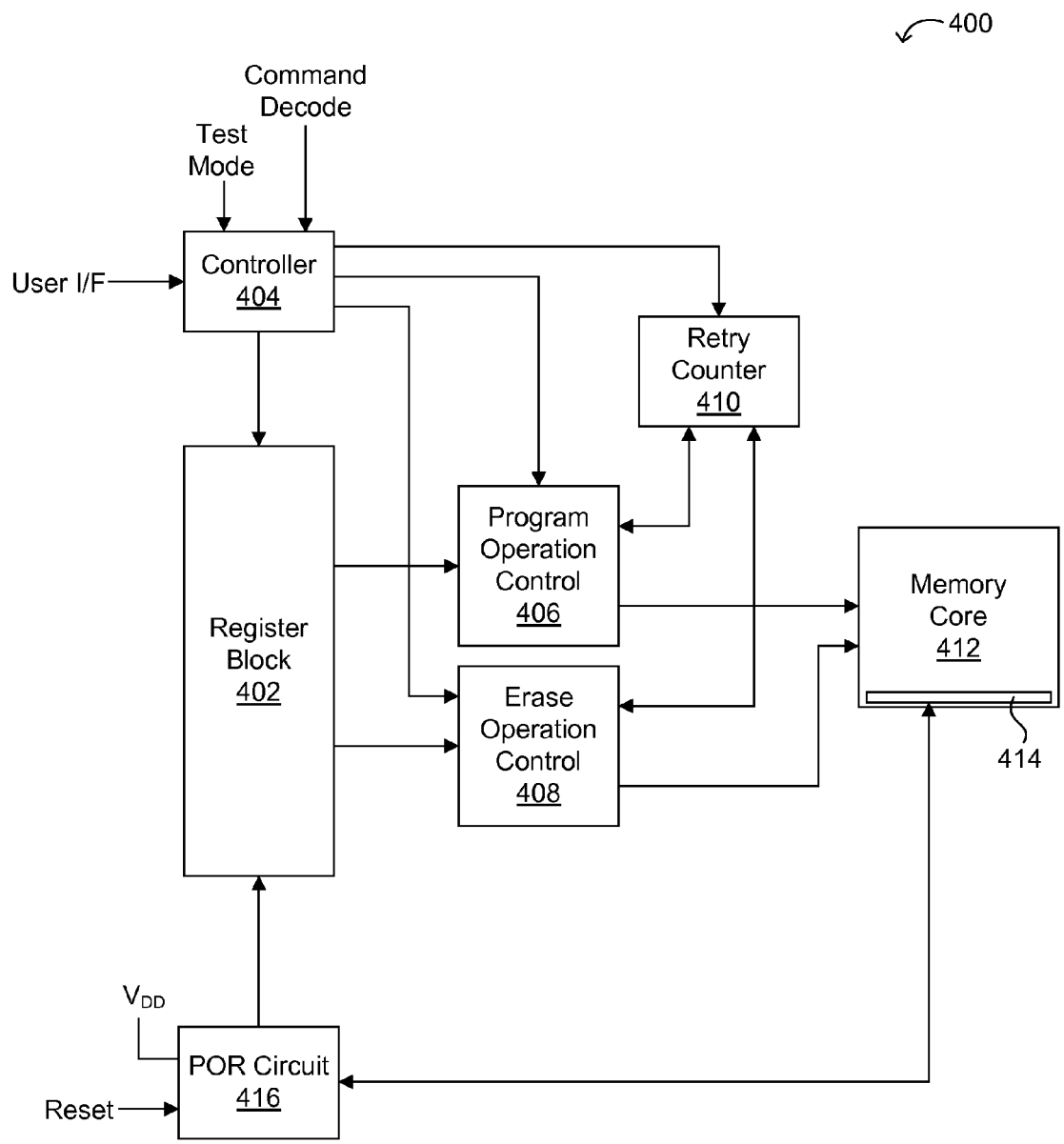
FIG. 4 is a schematic block diagram of an example register, control, and memory array structure, in accordance with embodiments of the present invention.

Referring now to FIG. 4, shown is a schematic block diagram 400 of an example register, control, and memory array structure, in accordance with embodiments of the present invention. For example, register block 402 can be implemented using static random access memory (SRAM). Register block 402 can provide algorithm and option variable selections to program operation control 406 and erase operation control 408. Controller 404 may determine and decode the received command, and can also control access to the register bits in register block 402. In addition, test modes (e.g., to determine distribution, etc.) can be used to override data in register block 402. Settings for register block 402 may be based on various default algorithm and option variable or condition settings, but can also be programmed on lot-by-lot or device-by-device basis. Also, values for program operations, erase operations, and option variable or related condition settings, can be independently programmed in register block 402.

Power on reset (POR) circuitry or state machine 416, which can receive a reset signal, can access designated register data portion 414 and read out data from that dedicated section of memory array 412. Designated register data portion 414 may alternatively be located outside of memory core 412. In any event, this accessed data that is associated with memory core 412 may then be loaded into register block 402. In this way, information specific to this device can be programmed into the memory core, and whenever the device is powered on (e.g., as detected by $V_{DD}$ supply) or otherwise reset, this data can be loaded into register 402. This is because the memory core, including designated register data portion 414 may include non-volatile memory. Also, different applications-based information can be stored in non-volatile memory designated register data portion 414. Further, different parts or memory cores 412 can be independently programmed (e.g., for different applications, etc.). In some cases, this dedicated portion of memory may not be accessible to the user. However, some applications may allow access to these designated locations, such as in a test mode.

Also, the non-volatile memory cells in designated register data portion 414 may be substantially identical to those in a remaining portion of memory core 412. For example, memory core 412 can include a plurality of memory cells that each can include a programmable impedance element or PMC. However, in some cases there may be some variety between the cells (e.g., programmable impedance element-based cells) of designated register data portion 414 relative to the cells found in other portions of memory core 412. For example, the cells of designated register data portion 414 may have a substantially similar structure relative to the other cells, but in order to accommodate higher retention for the critical data stored therein, the cells of designated register data portion 414 may be varied so as to provide improved retention.

In one or more test modes, controller 404 can override one or more values stored in register 402. When the test mode is complete, data in register block 402 can revert to the data that was previously stored in the register. For example, registers 402 may be implemented as two storage bits per register cell, one such bit representing an override value that is only enabled during predetermined modes (e.g., test mode, etc.), and another bit storing the data programmed outside of the test mode (e.g., during normal operation, power up, etc.). As another example, registers 402 may be implemented as a single bit per cell or stored data bit, and data can be reverted to its previous state by accessing designated register data portion 414 and asserting the reset signal upon completion of the test mode.

In addition, registers 402 may be programmable by controller 404 and/or by a user via a separate or combined user interface. In this way, a user may be able to program data into registers 402 in order to override or change previous values therein. Particular embodiments may also support independently controlled program/erase algorithm selection for different memory cores 412. For example, controller 404 can set the register values in 402 different for different memory cores 412. For example, register block 402 may include dedicated sectors (e.g., a widened register or increased register bit length) for each memory core, or register block 402 may be replicated for each memory core 412. This may be utilized whereby one memory array 412 is dedicated to one application (e.g., code), while another memory array 412 may be dedicated to another application (e.g., data). In this way, register block 402 may accommodate independently programmable operation algorithms in support of different operations for different memory cores 412.

Various program/erase operation algorithm information can be stored in register block 402. Option variables that define conditions (e.g., pulse widths, voltage levels, current levels, etc.) for the program and erase operations of the selected operation algorithm may also be defined in register block 402. In addition, a maximum number of retry attempts, which may be embedded within one or more of the program/erase algorithms may also be stored in register block 402. For example, retry counter 410 may keep track of a number of attempts for a given program or erase operation, or a sequence of program and/or erase operations, as part of a selected program/erase operation algorithm.

Particular embodiments may also support dynamically changing the operation algorithm as the semiconductor device ages, or arrays thereof are cycled more and more. For example, counters may be used to move to different algorithm and/or option variable selections and effectively change the program/erase algorithms to be used based on the counter results. In one example, designated register data portion 414 can be updated to reflect changed algorithm selections, option variables, etc., values based on such counter results. As a result, register block 402 can be updated via POR circuit 416, as discussed above. In another example, incremented values based on the counter results can be dynamically determined based on data output from register block 402. In this case, data that is read from register block 402 can then be updated by subsequent circuitry based on the counter results, before being provided as outputs to program operation control 406 and erase operation control 408.

Other fields (not shown) may be used to indicate option variables to set conditions for the various algorithms. Various fields of register block 402 may generally be used to form or support a conditions table that may be accessed (e.g., by program operation control 406, erase operation control 408, etc.) to set the conditions for one or more of the program and erase operations of a selected operation algorithm. For example, 24 registers can be included, where each register is 8-bits wide. In addition, such registers may support other programmable impedance device-based functions, such as word line voltage level, compliance current (e.g., where the cell is programmed until reaching this compliance current, X μA), equalization pulse width, single ended or differential sense amplifier configuration, as well as any number of other device functions and/or parameters.

As discussed herein "algorithms" can include one or more of testing algorithms, methods, operations and/or procedures, such as one or more of a plurality of program and erase operations to carry out a program or erase command. For example, one or more operations can include a series of program pulses with verifies in between and/or a series of erase pulses with verifies in between. Also, program/erase voltages and/or pulse widths may also be adjusted as a number of pulses or attempts increases.

Figure 5:
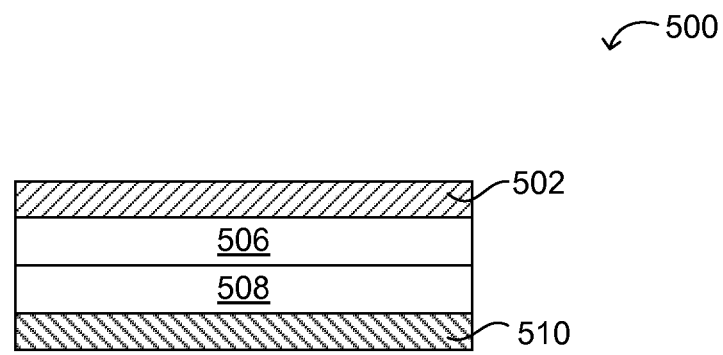
FIG. 5 is a diagram of an example memory cell structure in accordance with embodiments of the present invention.

Referring now to FIG. 5, shown is a diagram 500 of an example memory cell structure in accordance with embodiments of the present invention. In this particular cell arrangement, top electrode 502 may be a metal, or multiple metal layers, and can be coupled to other cells or programmable impedance devices via a common plate. Layer 506 can include an ion buffer layer (IBL), such as a Cu—Te base material (e.g., CuTe6, Cu—$Ge_2Sb_2Te_5$, etc.). Layer 508 can include an oxide (e.g., $SiO_2$, $Al_2O_3$, GdOx, etc.). Bottom electrode 510 can include or be connected to a contact, which can include, e.g., tungsten (W).

Some MOx devices, such as those shown in the particular example of FIG. 5, may exhibit "reverse" erase behavior during a program operation, and "reverse" programming behavior during an erase operation. For example, a reverse erase (similar to erase) behavior may be seen when executing a series of program operations. That is, the result of at least one of the series of program operations may result in an increase in cell resistance, as opposed to the decrease in cell resistance that often occurs from program operations. Similarly, a reverse program (similar to program) behavior may be seen when executing a series of erase operations. In such a case, the result of at least one of the series of erase operations may result in a decrease in cell resistance, as opposed to the increase in cell resistance that often occurs from erase operations.

The particular example structure shown in FIG. 5 may represent only one of a variety of programmable impedance element structures that may exhibit reverse program/erase behaviors. Other types of programmable impedance elements (e.g., the structure of FIG. 3) and related devices may also exhibit such reverse program behavior during a program operation, and reverse erase behavior during an erase operation. For example, different cell structures may see this behavior at different operating (program/erase) conditions (e.g., voltages, currents, pulse widths, etc.). Also, some programmable impedance elements or cells within a memory array or chip may experience reverse program/erase behavior, while others may not, for a given set of operating conditions. Thus despite the particular underlying programmable impedance element structure, and in order to address such behavior in execution of the proper (e.g., program or erase) command, particular embodiments contemplate including an erase operation in a program algorithm, as well as including a program operation in an erase algorithm.

Figure 6:
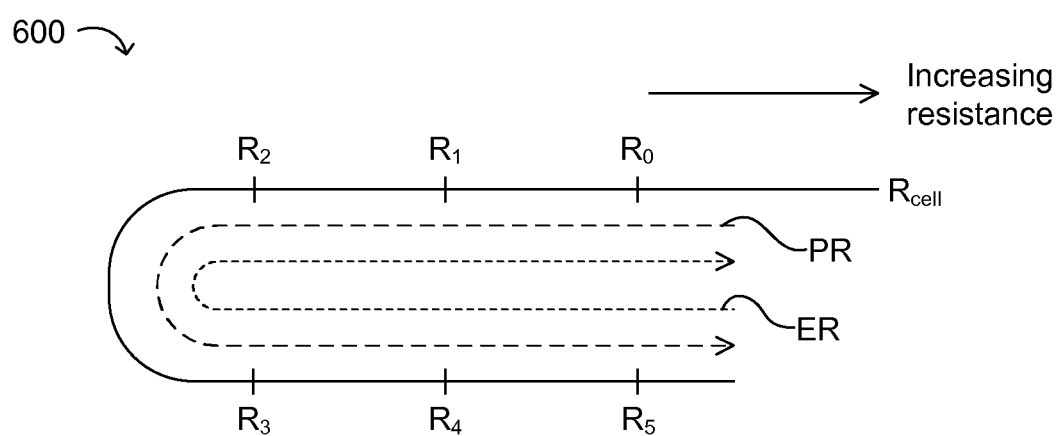
FIG. 6 is a diagram of an example memory cell resistance progression based on program and erase operations in accordance with embodiments of the present invention.

Referring now to FIG. 6, shown is a diagram 600 of an example memory cell resistance progression based on program and erase operations in accordance with embodiments of the present invention. In this diagram, resistance increases in going from left to right. A cell resistance of a programmable impedance element in an initial state (prior to being programmed for a first time or a "virgin" cell) may be represented as $R_0$, and can be in a range of about 1 GΩ. Program operations can be represented as a path PR whereby the subscript numbers increase for the strength of program operations (e.g., longer program time, higher voltage, higher current, etc.). A program operation can move the resistance to a lower resistance of $R_1$, and a stronger programming operation can decrease the resistance further to $R_2$. An even stronger program operation may result in a same or slightly increased resistance at $R_3$. As the strength of a program operation continues to increase, it can further increase resistance to $R_4$ and then to $R_5$. Of course, more or fewer program operations, as well as different resistance values or other characteristics for a given program operation sequence may alternatively occur. In any event, some program operations may exhibit reverse program behavior by actually increasing the cell resistance.

The cell resistance $R_{cell}$ can be measured and compared against a predetermined program state resistance $R_{on}$ to determine if a program operation was successful. For example, $R_{on}$ may be about 100 kω so $R_{cell}$ that is less than or equal to 100 kω can indicate a cell programmed state or a "1" data value. Program pulses can be applied and then cell resistance can be measured as part of a verify operation to determine if the previous program operation was successful. For example, if $R_{cell}$=200 kω then the process can be repeated with another program followed by another verify or measurement operation. In some cases, subsequent pulses may be stronger in terms of duration, as well as voltage and/or current levels. However, as FIG. 6 shows, the resistance may not always travel in one direction, such as from high resistance to low resistance, even for a series of program operations. For example, sequential program operations can result in values of $R_{cell}$ of about 200 kω after a first program operation, about 100 kΩ after a second program operation, about 50 kΩ after a third program operation, about 10 kΩ after a fourth program operation, about 100 kΩ after a fifth program operation, and so on, thus there may be a "reverse" erase that occurs while in a program mode to execute a program command.

In some applications, even a single long program pulse may provide sufficient energy whereby this reverse erase effect (e.g., effectively erased to 400Ω) can occur without a long program pulse sequence. If a program pulse is given and $R_{cell}$ increases instead of decreases, then the programmable impedance element may not have been successfully programmed. This situation may be represented as a bottom portion of the PR curve shown in FIG. 6. At some point, such as about 400 kΩ an erase pulse can be given in order to find out if the present regime for a given cell involves a program operation that reduces or increases cell resistance. Thus, the same $R_{cell}$=400 kΩ may appear as an erased or "0" data value state, but may actually be a programmed state that is effectively in disguise. In addition, if sufficient time is allowed or one or more erase pulses are allowed, the curve can slowly unwind as indicated by ER curve. Thus, the ER curve may be opposite to the PR curve; however, the ER and PR curves may not be fully symmetric. In addition, in some cases, the device can short itself out completely if too many pulses (e.g., program pulses) are applied. Thus for these cases, a limit of 10 or 100 pulses (e.g., via retry counter 410) can be provided, where thereafter the given operation is considered as unsuccessful.

Generally, if a device fails to program during a program operation, multiple program operation attempts may not help to successfully program the given programmable impedance element due to reverse erase behavior. Similarly, if a device fails to erase during an erase operation, multiple erase operation attempts may not help to successfully erase the given programmable impedance element due to reverse program behavior. As discussed above, limits via retry counter 410 may be applied within given program or erase operation commands. However, once these limits have been met, the opposite (e.g., erase for a program operation, or program for an erase operation) operation may be applied. Thus in particular embodiments, program and erase algorithms may take advantage of the reverse cycling behavior (e.g., of MOx based devices) in order to get the particular programmable impedance elements to cycle (e.g., program/erase) again. In this way, erase operations may be utilized to program the cells to low resistance (e.g., data value "1") states, and program operations may be utilized to erase the cells to high resistance (e.g., data value "0") states.

Figure 7:
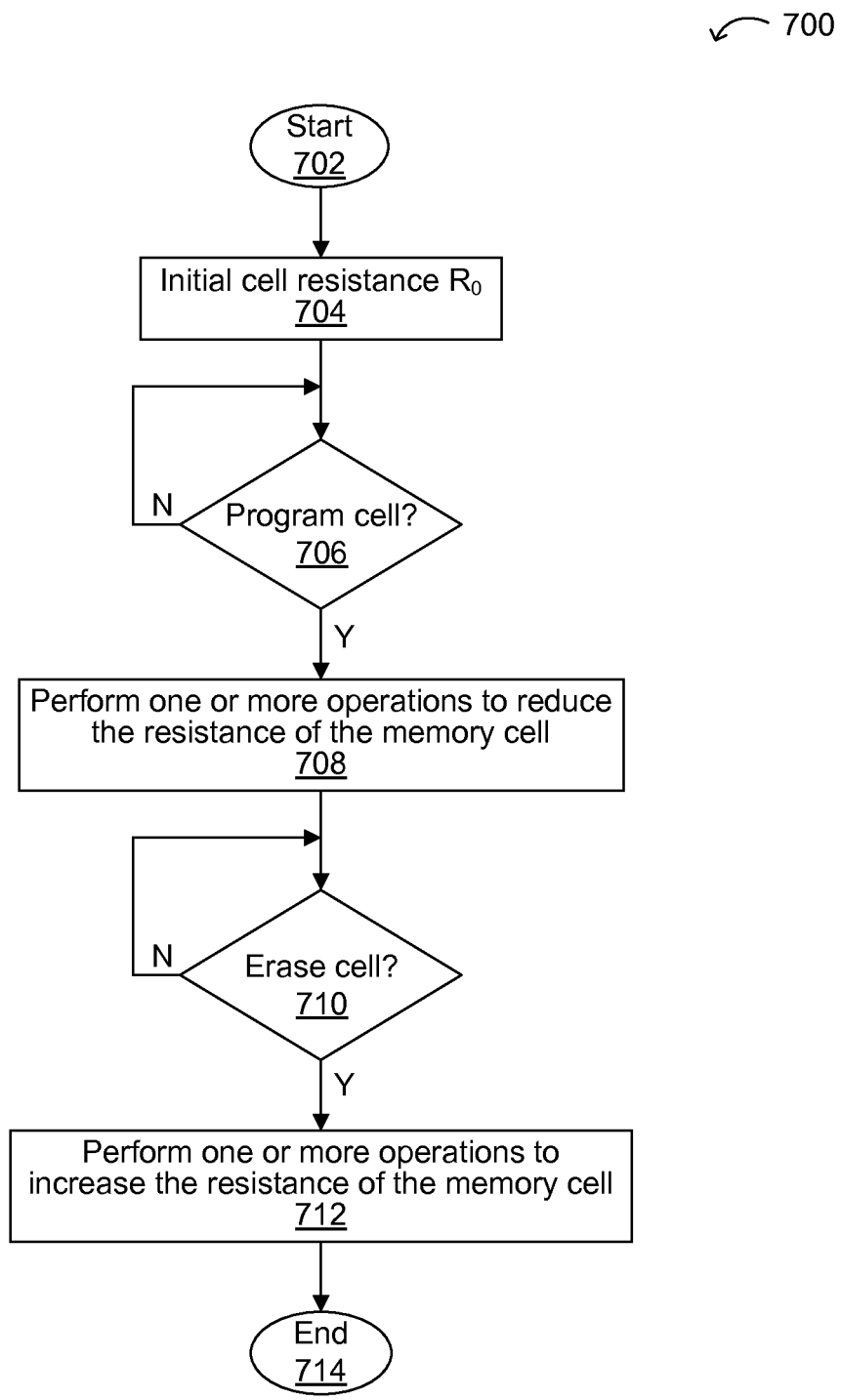
FIG. 7 is a flow diagram of example control for program and erase commands in accordance with embodiments of the present invention.

Referring now to FIG. 7, shown is a flow diagram 700 of example control for program and erase commands in accordance with embodiments of the present invention. The flow begins 702, and at 704 the cell resistance is $R_0$. This initial cell resistance of $R_0$ can actually be the preprogrammed resistance or "virgin" state of the cell when the device comes out of the fabrication facility, as opposed to being actively set by a command provided to the device. Because $R_0$ is the highest resistance value (e.g., about 1 GΩ.), there is no need to perform an initial erase operation, and this may be regarded as a data value "0" state. However, if the cell is to be programmed (706), at 708 one or more operations can be performed in order to reduce the resistance of the memory cell. For example, the cell resistance may be reduced to less than a predetermined $R_0$, resistance to be read as a data value "1" state.

If a programmed cell is to be erased (710), at 712 one or more operations can be performed in order to increase the resistance of the memory cell, completing the flow at 714. This can occur when a previously programmed cell is to be erased to return back to its original data value "0" state. For example, cell resistance may be increased to greater than a predetermined $R_{off}$ resistance to be read as a data value "0" state, and depending on the read-trip point. In particular embodiments, operations to reduce the cell resistance in 708 can include erase operations if previous program operations are unsuccessful, and similarly, operations to increase the cell resistance in 712 can include program operations if previous erase operations are unsuccessful. Example operations for 708 and 712 will be discussed in more detail below with reference to FIGS. 8 and 9, respectively.

Figure 8:
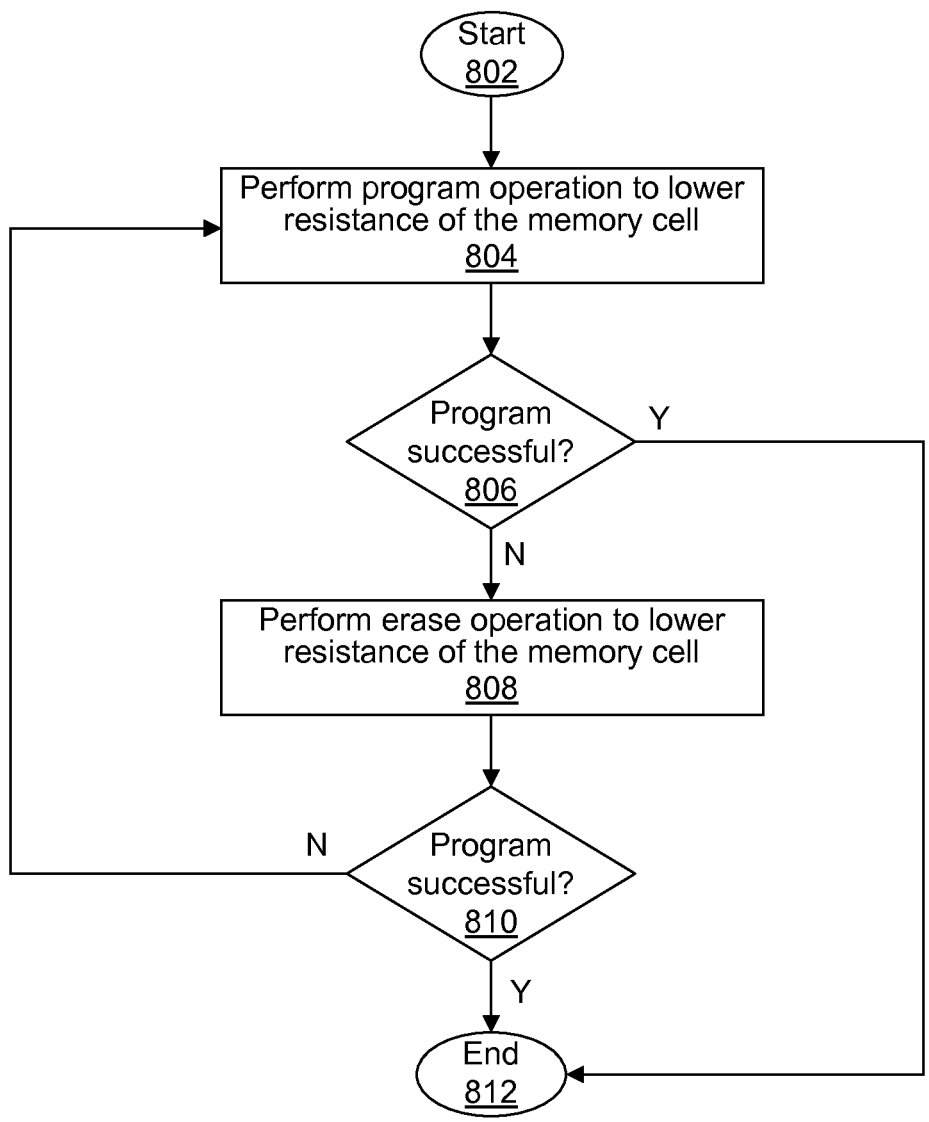
FIG. 8 is a flow diagram of an example program command operation algorithm in accordance with embodiments of the present invention.

Referring now to FIG. 8, shown is a flow diagram of an example program command operation algorithm 708 in accordance with embodiments of the present invention. For example, command decode 120 may decode externally provided signals in order to issue a program command. The flow can begin 802, and at 804 a program operation can be performed to lower the resistance of the memory cell. This program operation can include one or more separate operations, such as including different program pulse widths, voltages, currents, or other option variables (e.g., via register block 402 and program operation control 406). If the program operation is determined to be successful (e.g., $R_{cell}$ is less than or equal to $R_{on}$) at 806, the flow can complete at 812. A verify operation can be performed after each separate program operation in order to determine whether the previous program operation was successful.

However, if the program operation is determined to be unsuccessful (e.g., $R_{cell}$ is greater than $R_{on}$) at 806, an erase operation can be performed at 808 to lower the resistance of the memory cell. Thus in this case, the verify operation for a last of the one or more separate program operations or program pulses used to attempt to program the particular programmable impedance element may have still failed to program successfully. As discussed above, this may be due to a reverse erase effect that actually increases instead of decreases the cell resistance. Whether the cell programming has been successful is again determined by comparing the cell resistance $R_{cell}$ to the predetermined resistance value $R_{on}$. If the program has been determined as successful at 810, the flow can complete at 812. However, if the program has been determined as unsuccessful at 810, the flow can return to perform another program operation at 804. In some cases, a subsequent program operation at 804 may be successful at least in part due to the erase operation performed at 808.

Figure 9:
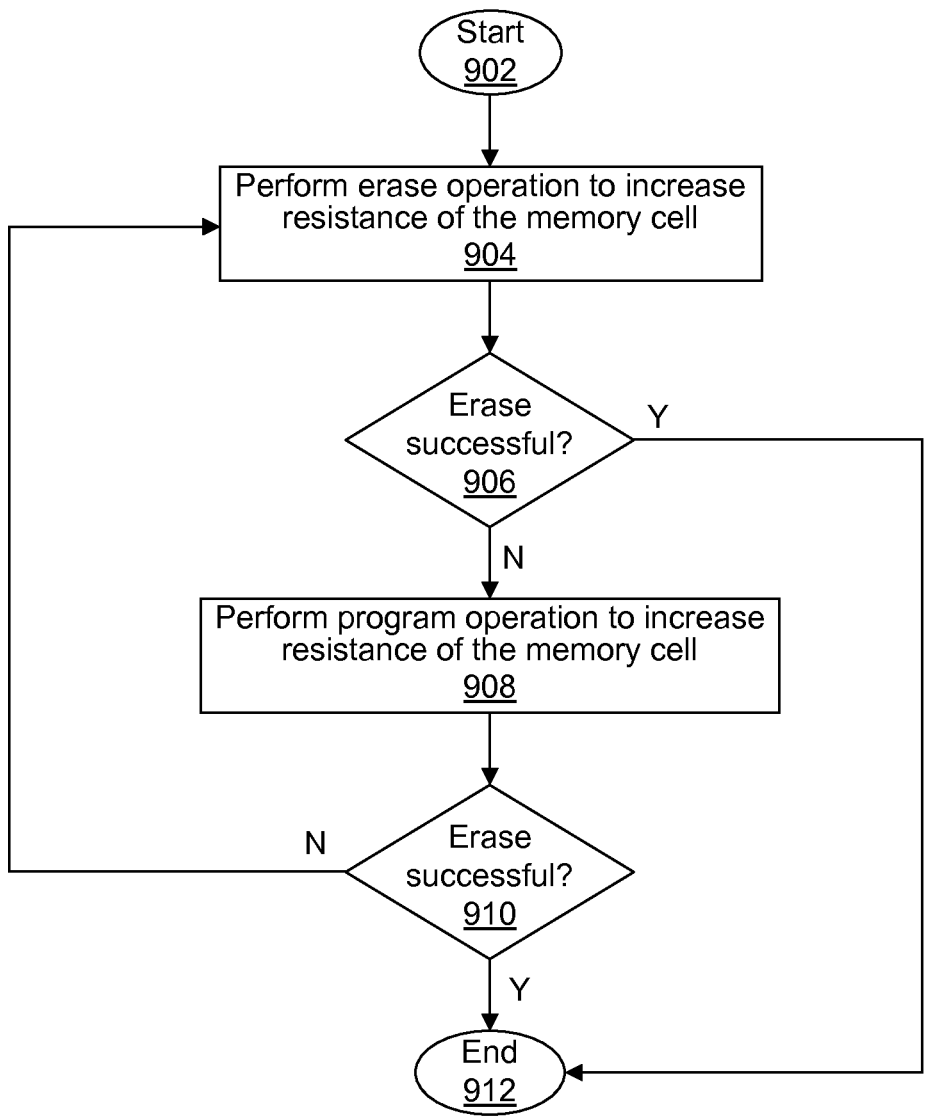
FIG. 9 is a flow diagram of an example erase command operation algorithm in accordance with embodiments of the present invention.

Referring now to FIG. 9, shown is a flow diagram of an example erase command operation algorithm 712 in accordance with embodiments of the present invention. For example, command decode 120 may decode externally provided signals in order to issue an erase command. The flow can begin 902, and at 904 an erase operation can be performed to increase the resistance of the memory cell. This erase operation can include one or more separate operations, such as including different erase pulse widths, voltages, currents, or other option variables (e.g., via register block 402 and erase operation control 408). If the erase operation is determined to be successful (e.g., $R_{cell}$ greater than a predetermined off value $R_{off}$) at 906, the flow can complete at 912. A verify operation can be performed after each separate erase operation in order to determine whether the previous erase operation was successful.

However, if the erase operation is determined to be unsuccessful (e.g., $R_{cell}$ is less than or equal to $R_{off}$) at 906, a program operation can be performed at 908 to increase the resistance of the memory cell. Thus in this case, the verify operation for a last of the one or more separate erase operations or erase pulses used to attempt to erase the particular programmable impedance element may have still failed to erase successfully. As discussed above, this may be due to a reverse program effect that actually decreases instead of increases the cell resistance. Whether the cell erasing has been successful is again determined by comparing the cell resistance $R_{cell}$ to the predetermined resistance value $R_{off}$. If the erase has been determined as successful at 910, the flow can complete at 912. However, if the erase has been determined as unsuccessful at 910, the flow can return to perform another erase operation at 904. In some cases, a subsequent erase operation at 904 may be successful at least in part due to the program operation performed at 908.

Figure 10:
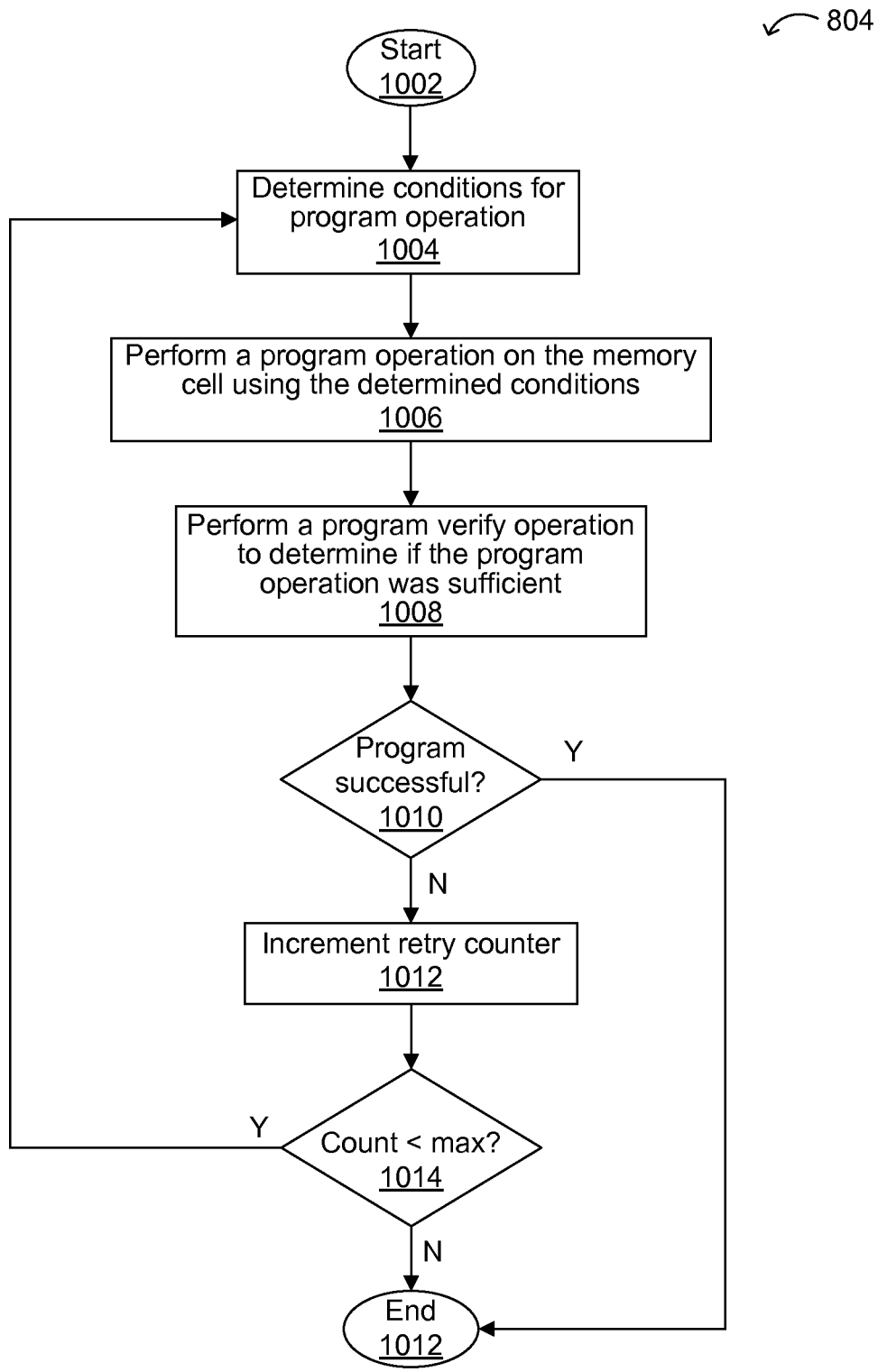
FIG. 10 is a flow diagram of an example program operation in accordance with embodiments of the present invention.

Referring now to FIG. 10, shown is a flow diagram of an example program operation 804 in accordance with embodiments of the present invention. Thus, this example shows more detailed steps can occur as part of program operation 908. Also, similar steps for erase operations can occur as part of erase operations 808 and/or 904. In FIG. 10, the flow begins 1002, and at 1004 conditions can be determined for the program operation. For example, option variables can be accessed via register block 402 and program operation control 406 in order to set pulse widths, voltages, currents, and so on, to enact conditions for the program operation. At 1006, a program operation can be performed on the accessed memory cell using the determined conditions.

At 1008, a program verify operation can be performed to determine if the program operation was sufficient. As discussed above, the program verify can include a comparison of cell resistance $R_{cell}$ against a predetermined on or data value "1" indicated resistance $R_{on}$. If the program operation was successful at 1010, the flow can complete at 1012. However, if the program operation was not successful at 1010, the retry counter (e.g., 410) can be incremented at 1012. The retry counter may alternatively be incremented prior to step 1006. If the retry count is less than the maximum allowed at 1014, the flow can return to determine conditions for another program operation at 1004. However, if the retry count meets or exceeds the maximum allowed at 1014, the flow can complete at 1014. In this case, the program operation overall can be determined as failed despite repeated attempts up to the maximum allowable attempts per the retry counter. As discussed above, the program flow at this point can return (see, e.g., FIG. 8) to perform an erase operation to address potential reverse erase issues, and to allow the cell to properly cycle.

Conventional algorithms may only force a series of programming or erasing operations to continue once started. However, in particular embodiments, if a program attempt (e.g., a predetermined number of program operations) fails, then an erase operation may be interjected in order to program the storage cell. Further, such an algorithm may be workable even if the phenomenon of reverse program and reverse erase does not occur for a particular device or memory cell structure. Instead, such unaffected devices may be subjected to extra program or erase cycles, but without causing harm to the memory cells.

In some applications, longer program/erase pulses can be provided, but once a certain threshold is reached, the voltage provided may not matter as much. Also, a current limiter may be provided to protect the cell, and the reverse program/erase phenomenon may be dependent on the programming or erasing time. As such, there may be a thermal aspect to the phenomenon. In any event, particular embodiments can address this behavior by providing for a subsequent erase operation during execution of a program command, and/or by providing for a subsequent program operation during execution of an erase command.

It is also noted that, while only two storage states (state "0" and state "1") have been significantly described herein with respect to program and erase operations, PMCs may also each support more than one memory state. For example, depending on the voltage level controls, instead of a full erase or a full program/write, partial operations (e.g., by applying less/predetermined voltages for forward bias and reverse bias of the PMC) can be performed. Such partial operations can produce different resistance values in the cell, as opposed to the cell having an on/off resistance corresponding to two storage states. Instead, a binary coding of, e.g., eight different bands or ranges of PMC on resistances can be converted into 3-bit storage values. Thus in this example, eight different data values can be stored in a given PMC. Of course, other numbers of data values can be stored based on the resistance and bias voltage characteristics.

While the above examples include circuit, operating modes, and structural implementations of certain memory cells and programmable impedance devices, one skilled in the art will recognize that other technologies, operating modes, operation algorithms, and/or cell structures can be used in accordance with embodiments. Further, one skilled in the art will recognize that other device circuit arrangements, architectures, elements, and the like, may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of erasing a programmable impedance element, the method comprising:
    a) receiving an erase command to be executed on the programmable impedance element;
    b) performing an erase operation on the programmable impedance element in response to the erase command;
    c) determining if the erase operation successfully erased the programmable impedance element; and
    d) performing a program operation for erasing the programmable impedance element in response to the erase operation failing to successfully erase the programmable impedance element.

2. The method of claim 1, wherein:
    a) the program operation comprises a plurality of program operations; and
    b) the erase operation comprises a plurality of erase operations.

3. The method of claim 1, wherein the determining if the erase operation successfully erased comprises:
   a) measuring a cell resistance of the programmable impedance element; and
   b) comparing the cell resistance against a predetermined resistance to determine if the cell resistance is greater than the predetermined resistance.

4. The method of claim 1, wherein the performing the erase operation comprises decreasing a cell resistance of the programmable impedance element.

5. The method of claim 1, wherein the performing the program operation comprises increasing a cell resistance of the programmable impedance element.

6. The method of claim 1, wherein the programmable impedance element is part of a memory array having a plurality of memory cells, wherein each of the memory cells comprises:
   a) an active electrode of the programmable impedance element being coupled to a bit line; and
   b) a transistor having a drain coupled to the inert electrode of the programmable impedance element, a gate coupled to a word line, and a source coupled to a source line.

7. The method of claim 1, wherein the programmable impedance element comprises:
   a) an inert electrode coupled to a first side of a solid electrolyte;
   b) an active electrode coupled to a second side of the solid electrolyte, wherein the programmable impedance element is programmed by formation of a conductive path between the active and inert electrodes; and
   c) a plurality of mobile elements derived from the active electrode, wherein the plurality of mobile elements are reduced in the solid electrolyte to form the conductive path.

8. The method of claim 7, wherein:
   a) the conductive path in the programmable impedance element is formed by application of a first voltage across the active and inert electrodes, the conductive path remaining once formed after the first voltage is removed; and
   b) at least a portion of the conductive path is dissolved to erase the programmable impedance element by application of a second voltage across the active and inert electrodes.

9. The method of claim 2, wherein each of the plurality of program operations comprises selecting an option variable for at least one of pulse widths, voltages, and currents.

10. The method of claim 2, wherein each of the plurality of erase operations comprises selecting an option variable for at least one of pulse widths, voltages, and currents.

11. The method of claim 1, wherein the programmable impedance element comprises an ion buffer layer (IBL) and an oxide.

12. The method of claim 1, wherein the programmable impedance element exhibits reverse program/erase behavior.

13. The method of claim 1, wherein the performing the erase operation comprises incrementing a retry counter.

14. The method of claim 13, wherein the determining if the erase operation successfully erased comprises comparing the retry counter against a retry limit.

15. The method of claim 14, wherein the erase operation is determined to have failed to successfully erase the programmable impedance element when the retry counter reaches the retry limit.

\* \* \* \* \*